(12) United States Patent
Sandoval et al.

(10) Patent No.: US 11,094,489 B2
(45) Date of Patent: Aug. 17, 2021

(54) SEAL HOUSING FOR AN ELECTRICAL DEVICE AND SEALED RELAY USING THE SEAL HOUSING

(71) Applicant: Tyco Electronics Componentes Electromecanicos Lda., Evora (PT)

(72) Inventors: Louis Sandoval, Evora (PT); Nuno Leal, Vila Nova de Gaia (PT)

(73) Assignee: Tyco Electronics Componentes Electromecanicos Lda., Evora (PT)

( * ) Notice: Subject to any disclaimer, the term of this patent is extended or adjusted under 35 U.S.C. 154(b) by 168 days.

(21) Appl. No.: 16/146,722

(22) Filed: Sep. 28, 2018

(65) Prior Publication Data
US 2019/0103239 A1    Apr. 4, 2019

(30) Foreign Application Priority Data

Sep. 29, 2017   (EP) ..................... 17398004

(51) Int. Cl.
*H01H 9/02* (2006.01)
*H01H 50/02* (2006.01)
*H01H 50/04* (2006.01)
*H01H 50/14* (2006.01)
*H05K 5/02* (2006.01)

(52) U.S. Cl.
CPC .......... *H01H 50/023* (2013.01); *H01H 50/02* (2013.01); *H01H 50/04* (2013.01); *H01H 50/14* (2013.01); *H05K 5/0217* (2013.01); *H01H 2223/002* (2013.01); *H01H 2223/044* (2013.01); *H01H 2239/034* (2013.01)

(58) Field of Classification Search
CPC ..... H01H 50/023; H01H 50/14; H05K 5/0217

USPC .......................................................... 335/202
See application file for complete search history.

(56) References Cited

U.S. PATENT DOCUMENTS

| 4,307,362 | A | * | 12/1981 | Kobler | ............... H01H 51/2227 335/202 |
| 4,430,537 | A |   | 2/1984 | Sauer et al. | |
| 4,594,644 | A | * | 6/1986 | Painter | ................. H05K 5/0095 174/522 |
| 4,748,294 | A | * | 5/1988 | Bartel | .................. H01H 50/023 174/564 |

(Continued)

FOREIGN PATENT DOCUMENTS

| CN | 203367153 U | 12/2013 |
| CN | 105845507 A | 8/2016 |

(Continued)

OTHER PUBLICATIONS

Abstract of CN203367153, dated Dec. 25, 2013, 1 page.
(Continued)

*Primary Examiner* — Shawki S Ismail
*Assistant Examiner* — Lisa N Homza
(74) *Attorney, Agent, or Firm* — Barley Snyder

(57) ABSTRACT

A seal housing for an electrical device comprises a base, a cover adapted to cover an inwardly facing side of the base to form a closed chamber for accommodating components of the electrical device, and a sealing plate adapted to partially cover an outwardly facing side of the base. The sealing plate has an outward side with a profile that is shaped to divert fluid or fluid condensate formed at the outward side of the sealing plate.

18 Claims, 4 Drawing Sheets

(56) References Cited

U.S. PATENT DOCUMENTS

| | | | | |
|---|---|---|---|---|
| 5,673,011 A | * | 9/1997 | Okihara | H01H 50/043 |
| | | | | 335/128 |
| 5,814,765 A | | 9/1998 | Bauer et al. | |
| 6,049,263 A | * | 4/2000 | Vilou | H01H 51/065 |
| | | | | 290/38 R |
| 8,188,818 B2 | * | 5/2012 | Cho | H01H 51/065 |
| | | | | 335/126 |
| 8,471,656 B2 | * | 6/2013 | Horii | H01H 50/04 |
| | | | | 335/78 |
| 2008/0143463 A1 | * | 6/2008 | Imanishi | H01H 50/443 |
| | | | | 335/202 |
| 2008/0296843 A1 | * | 12/2008 | Hoffmann et al. | 335/202 |
| 2011/0032059 A1 | * | 2/2011 | Ito | H01H 50/14 |
| | | | | 335/202 |
| 2017/0163015 A1 | | 6/2017 | Imaizumi | |
| 2018/0053615 A1 | * | 2/2018 | Nakahara | H01H 50/023 |

FOREIGN PATENT DOCUMENTS

| | | |
|---|---|---|
| JP | H10256751 A | 9/1998 |
| JP | 2002245916 A | 8/2002 |

OTHER PUBLICATIONS

Abstract of JP2002245916, dated Aug. 30, 2002, 1 page.
European Search Report, dated Mar. 16, 2018, 11 pages.
Abstract of CN105845507, dated Aug. 10, 2016, 1 page.
Abstract of JPH10256751, dated Sep. 25, 1998, 1 page.
EPO Communication, dated Jul. 30, 2020, 6 pages.

\* cited by examiner

SEAL HOUSING FOR AN ELECTRICAL DEVICE AND SEALED RELAY USING THE SEAL HOUSING

CROSS-REFERENCE TO RELATED APPLICATION

This application claims the benefit of the filing date under 35 U.S.C. § 119(a)-(d) of European Patent Application No. 17398004.6, filed on Sep. 29, 2017.

FIELD OF THE INVENTION

The present invention relates to an electrical device and, more particularly, to a seal housing for an electrical device.

BACKGROUND

Electrical devices, such as electromagnetic relays, with sealed, fluid-tight housings for protecting the electrical device components against the penetration of fluids, moisture and/or dew condensate, are frequently employed in applications where water condensate or icing is likely to occur. For instance, such a situation may occur when the electrical device is mounted in areas where temperature may drop abruptly, such as below air conditioning systems of automobile vehicles.

FIG. 1 depicts an exemplary configuration of such a conventional sealed relay 100. The relay assembly components (not shown) are accommodated inside a housing 110 from which electrical terminals 120 of the relay 100 protrude through a flat base 130 of the relay 100. The penetration of fluids, moisture or dust into the sealed relay 110 through the base 130 is prevented by a sealing glue 140 that is applied over the entire surface of the relay base 130. This configuration of the sealed relay 100 effectively avoids external fluids or moisture penetrating inside the relay housing. However, this conventional configuration still has the shortcoming that external fluids or moisture at the relay base 130 may establish short-circuit paths between the relay terminals 120 and, therefore, lead to defective operation of the sealed relay 100. In particular, the risk of short-circuits forming between the relay terminals 120 increases substantially if the sealed relay 100 is mounted in an orientation that facilitates the accumulation of fluid or dew condensate between terminals 120, such as when the sealed relay 100 is mounted with the base 130 and terminals 120 facing upwards (i.e. in the direction opposed to gravity) as shown in FIG. 1. Another disadvantage of the sealed relay 100 shown in FIG. 1 is that it requires a significant amount of sealing glue 140, which leads to increased production costs.

Other solutions for reducing the possibility of defective operation caused by condensation or penetration of fluids into the relay housing have been advanced. For instance, published patent application JP 2002/245916 A describes an open type electromagnetic relay in which the relay contacts are provided within a contact chamber that is covered by a cover, the contact chamber and the cover being sealed by a resin tubular body formed with two parts for preventing or suppressing the invasion of moisture into the contact chamber. Publication CN 203367153 U describes a waterproof-type automotive relay in which an upper cover and lower cover of the waterproof-type automotive relay are connected in a sealing manner by a waterproof heat-conducting glue for improving the sealing function against dust and water as well as the conduction of the heat dissipated by the relay assembly. Published patent application U.S. Pat. No. 4,430,537 describes a getter for use within a sealed contact chamber and which consists of a porous getter material that acts to adsorb substances which could create resistive films on the electrical contacts.

Although the above configurations may effectively improve the protection of the components inside the housings against the penetration of fluids or moisture, they do not provide an effective protection of the electrical terminals outside the housing against the effects of moisture or condensation. As a consequence, the respective sealed relays cannot be mounted in all orientations without the risk of causing short-circuits between the terminals. Accordingly, there is still the need for seal housings for electrical devices, such as electromagnetic arrays, and of the respective sealed electrical devices using the seal housings that can be securely used in environments where the presence of fluids or dew condensation is likely to occur, that are cost effective and that reduce or even eliminate the risk of failure caused by dew condensation or moisture between the relay terminals, irrespectively from the mounting orientation of the sealed electrical device.

SUMMARY

A seal housing for an electrical device comprises a base, a cover adapted to cover an inwardly facing side of the base to form a closed chamber for accommodating components of the electrical device, and a sealing plate adapted to partially cover an outwardly facing side of the base. The sealing plate has an outward side with a profile that is shaped to divert fluid or fluid condensate formed at the outward side of the sealing plate.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
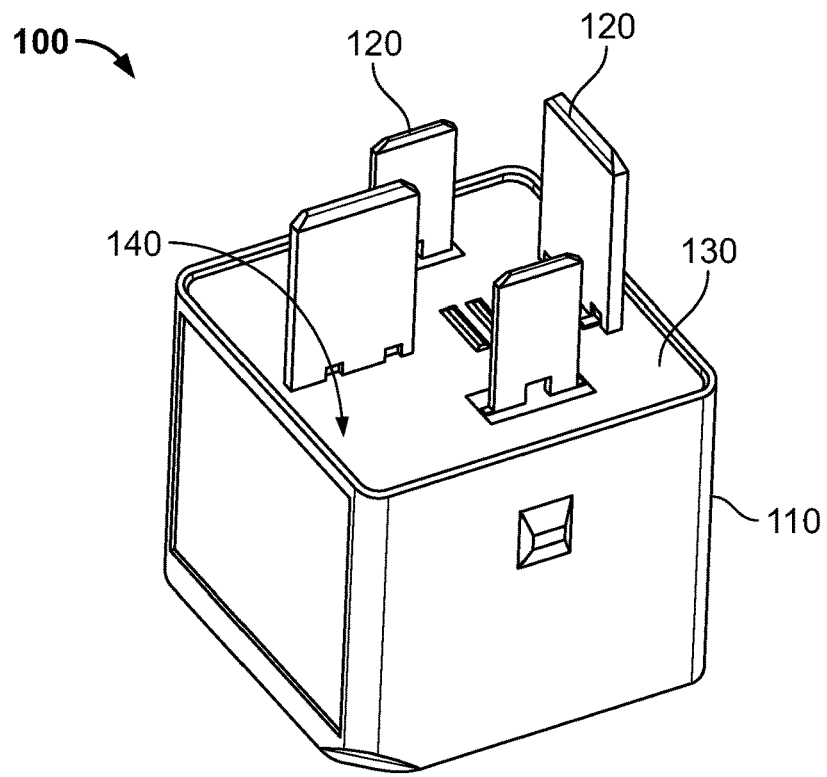
FIG. 1 is a perspective view of a known sealed relay.

Embodiments of the present invention will be described hereinafter in detail with reference to the attached drawings, wherein like reference numerals refer to the like elements. The present invention may, however, be embodied in many different forms and should not be construed as being limited to the embodiments set forth herein; rather, these embodiments are provided so that the disclosure will be thorough and complete and will fully convey the concept of the invention to those skilled in the art. In particular, although certain features of the exemplary embodiments below will be described using terms such as "top", "bottom", "upper", "outward" and "inward", these terms are used for the sole purpose of facilitating the description of the respective features and their relative orientation and should not be construed as limiting the claimed invention or any of its components to a use in a particular spatial orientation. Like numbers refer to like elements throughout the description.

Figure 2:
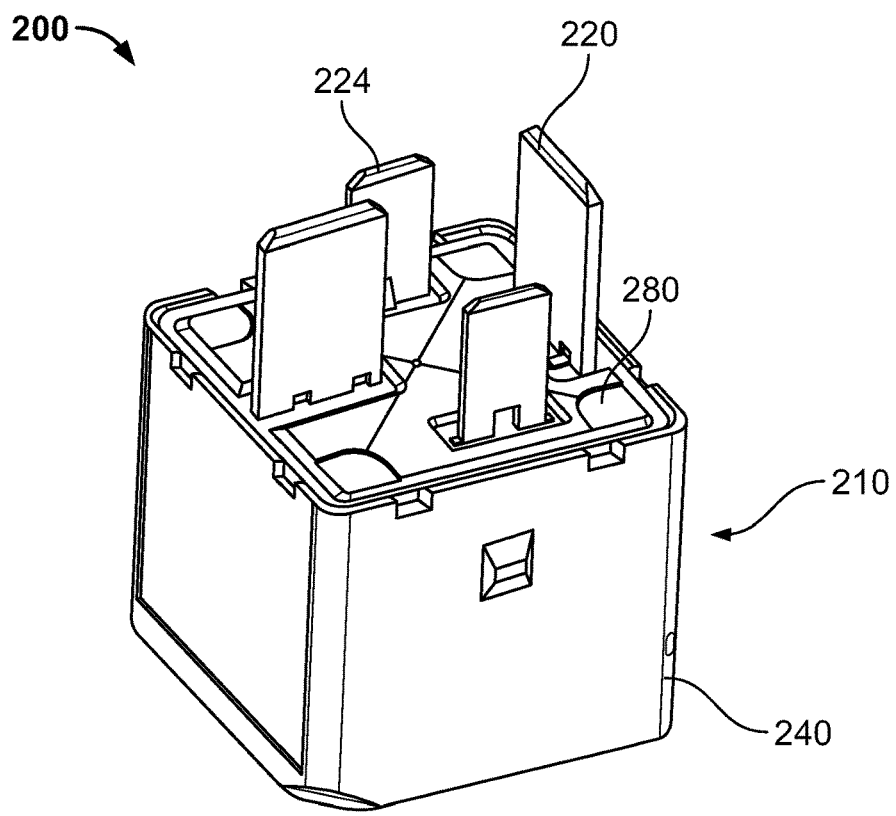
FIG. 2 is a perspective view of a sealed relay and a seal housing of the sealed relay according to an embodiment.

A sealed relay 200 having a seal housing 210 according to an embodiment is shown in FIG. 2. The sealed relay 200 is shown in FIG. 2 in a mounting orientation where the relay terminals 220, 224 are facing upwards. The seal housing 210 comprises a base 230 for mounting a relay assembly (not shown) on an inward side of the base 230 and a cover 240 for covering the relay assembly. For simplicity reasons, hereinafter the side of the base 230 facing to the inside of the housing 210 shall be referred to as the inwardly facing side and the side of the base 230 facing to the outside of the housing 210 as the outwardly facing side. The base 230 and the relay cover 240 are fitted together so as to form a closed chamber for accommodating the relay assembly components inside.

Figure 3:
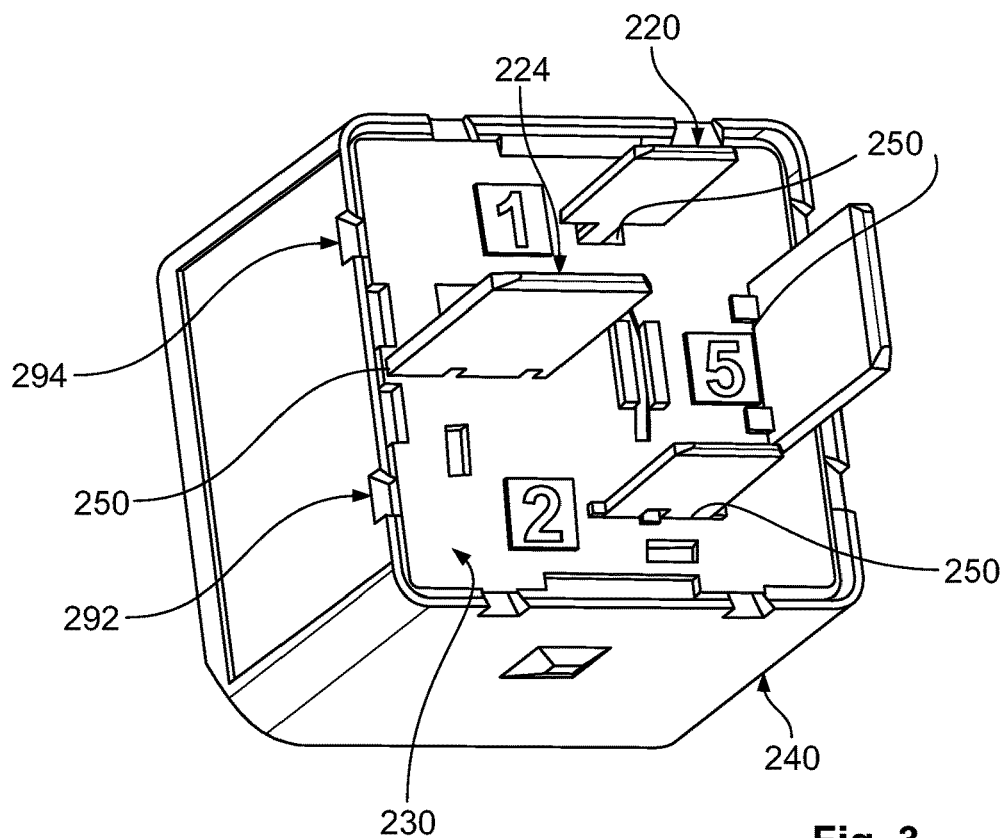
FIG. 3 is a perspective view of the sealed relay in an initial stage of assembly.

As shown in FIG. 3, one or more apertures 250 are provided on the base 230 for passing one or more electric terminals 220, 224 to the outwardly facing side of the base 230 to couple the relay assembly to external electric circuits. In order to prevent dust, fluid or moisture from penetrating into the housing 210 through the base apertures 250 for the electrical terminals 220, 224, the junction between each base aperture 250 and the respective terminal 220, 225 is sealed from the outside with a sealing compound 140, such as a glue, that is applied on a discrete region forming patches 260, and/or stripes 270 shown in FIG. 4 around the aperture 250 and respective terminal 220, 225 on the outwardly facing side of the base 230.

Figure 4:
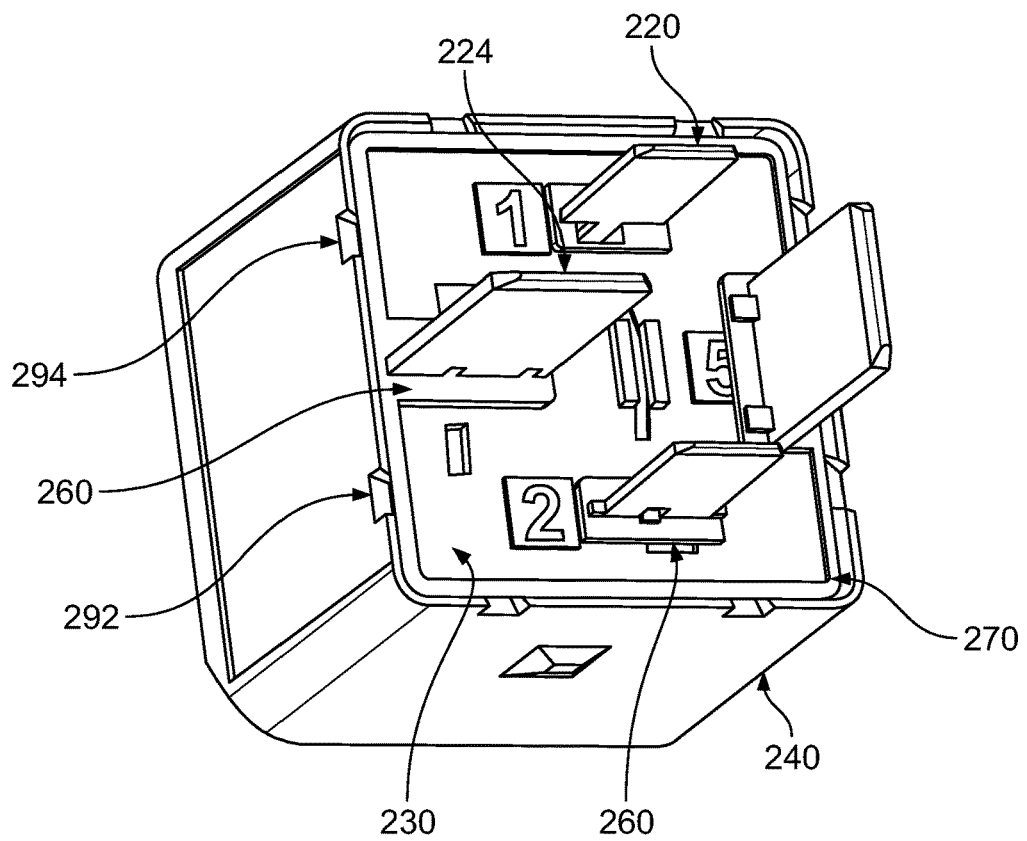
FIG. 4 is a perspective view of the sealed relay in an intermediate stage of assembly.

The fluid-tightness of the junction between the cover 240 and the base 230 may be improved by making the sidewalls of the cover 240 overlap the lateral sides of the base 230 and slightly pass beyond the outward surface of the base 230 so as to form an intersection edge on the outward side of the base 230 that can be sealed by applying a stripe 270 of sealing compound along the intersection edge, as shown in FIG. 4. FIG. 4 shows an intermediate assembly stage of the sealed relay 200, after the relay assembly and base 230 are closed with the relay cover 240 and the sealing compound is applied in discrete patches 260 and stripes 270 around the relay terminals 220, 224 and along the intersection edge of the base 230, respectively.

In contrast with the conventional relay shown in FIG. 1, in which the sealing compound 140 is applied over the entire relay base 130, in the embodiments of the present description the sealing compound 140 is applied only on the patches and stripes 260, 270 that circumvent intersection edges between the base 230 and the cover 240 and/or at the intersection between the electrical terminals 220, 224 and respective apertures 250 on the base 230.

Figure 5:
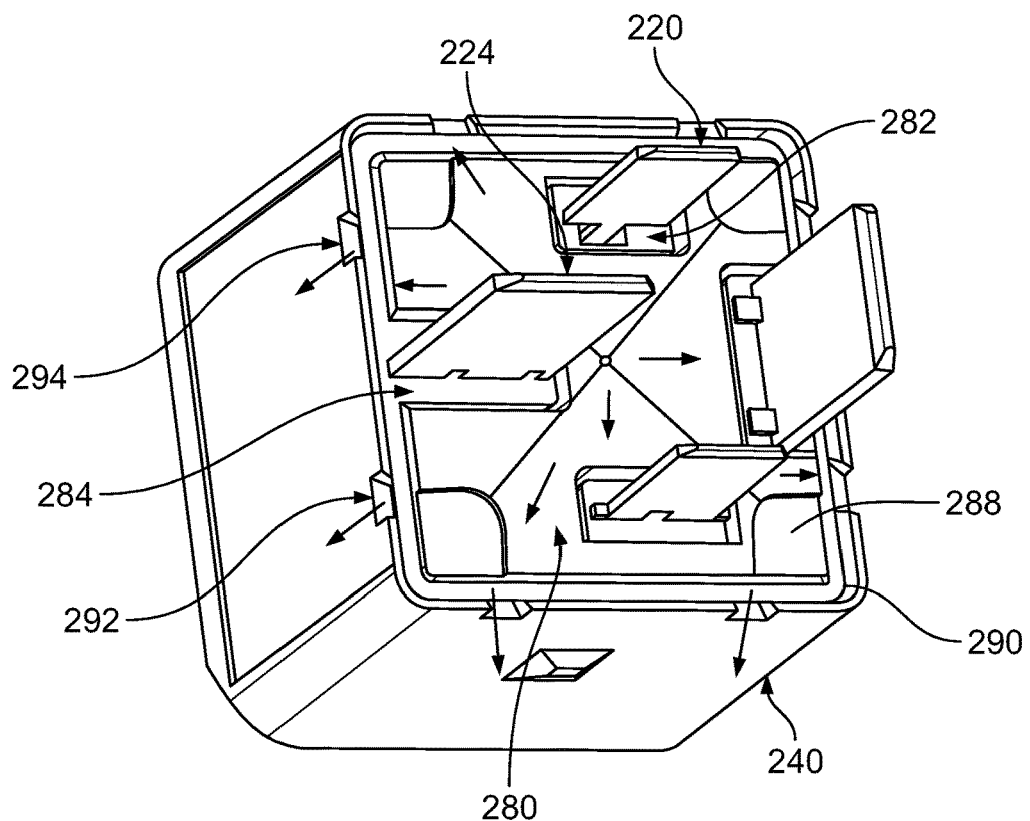
FIG. 5 is a perspective view of the relay in a final stage of assembly.

In order to further improve fluid-tightness of the housing base 230 and prevent the occurrence of short circuits due to dew condensation and/or fluids accumulated between the electric terminals 220, 224 that protrude outwards from the base 230, a sealing plate 280 for partially covering the area of the base 230 and isolating the electrical terminals 220, 224 from each other may be provided, as shown in FIG. 5.

As shown in FIG. 5, the sealing plate 280 has a cut profile with one or more apertures 282, 284 through which the electrical terminals 220, 224 protruding from the base 230 extend. Each aperture 282, 284 of the sealing plate 280 is sized to allow a separation gap to the respective electrical terminal 220, 224 so that the sealing plate 280 does not enter in direct contact with the electrical terminals 220, 224. In an embodiment, the dimensions of the apertures 282, 284 are matched with the size of the patches 260 of the sealing compound deposited around each electrical terminal 220, 224 protruding from the base 230 so that the sealing plate 280 and the patches 260 closely contact each other but without overlapping when the sealing plate 280 is arranged on top of the base 230. Accordingly, the edges of the sealing plate apertures 282, 284 also become sealed by the patches 260, which avoids that liquids or moisture penetrate into the space between the sealing plate 280 and the base 230. Thus, since the sealing material is applied only at the intersection regions between the base 230, the cover 240 and/or the electrical terminals 220, 224 that are not covered by the sealing plate 280, the amount of sealing compound used can be significantly reduced.

The thickness of the sealing plate 280, and in particular, at the edges of each of its apertures 282, 284 is larger than the thickness of the sealing material deposited on the base 230 so that the sealing plate 280 also acts as a physical barrier that isolates the terminals 220, 224 protruding from the base 230 from each other, and therefore, prevents short-circuit paths from being established by the accumulation of moisture or dew condensation between the relay terminals 220, 224. Moreover, due to the difference in thickness between the sealing compound patches 260 and the edges of the sealing plate 280 around each electrical terminal 220, 224, a fluid reservoir with the width of the respective separation gap is formed around each of the electrical terminals 220, 224 that allows localizing any fluid or dew condensate that may be formed around the electrical terminals 220, 224 and/or diverted from the sealing plate 280.

As shown in FIG. 5, one or more of the sealing plate apertures may be closed apertures 282 that completely isolate the respective electrical terminals 220 from neighboring terminals on the base 230. On the other hand, a number of the sealing plate apertures 284 may open into an evacuation channel 290 so as to allow evacuation of the fluid accumulated in the apertures 284 around the respective terminals 224. A mixed distribution of closed 282 and opened apertures 284 may be provided on the sealing plate 280 depending on the position and/or size of the electrical terminals 220, 224. For instance, opened 284 and closed apertures 282 may be alternated around the sealing plate 280 so as to isolate neighboring terminals from each other and maximize the length of any connecting paths that could eventually be formed by fluid accumulated in the opened reservoirs or apertures via the evacuation channel 290. The opened apertures 284 may also be assigned to the largest relay terminals 224 and/or areas where a larger amount of dew condensation is likely to occur, while allowing fluid accumulated in the opened apertures 284 to be expelled via the evacuation channel 290.

An exemplary evacuation channel 290 that is provided around the base edges is shown in FIG. 5. The evacuation channel 290 is formed by dimensioning the sealing plate 280 so as to leave a distance to the side wall of the relay cover 240 when mounted on top of the base 230. As a result, an evacuation channel 290 with the width of the distance to the cover edge is formed around the perimeter of the underlying base 230. The evacuation channel 290 may receive and accumulate the moisture or dew condensation that is diverted from the sealing plate 280 towards the edges of the base 230, in particular when the sealed relay 200 is mounted in the upward direction, as well as from any of the apertures 284 around the electrical terminals 224 that open into the evacuation channel 290. The height of the evacuation channel 290 is approximately equal to the difference between the thickness of the sealing compound deposited around the relay base edge and the thickness of the sealing plate edge.

The evacuation of fluid accumulated in the evacuation channel 290 away from the base 230 may be facilitated by providing one or more cuts or slots 292 on the relay cover 240 along the evacuation channel 290, as shown in FIGS. 3-5. In the shown embodiment, the evacuation channel 290 at each of the lateral sides of the cover 240 has two slots 292, 294, placed closer to the cover corners where it is expected that a higher amount of fluid will be accumulated. However, the number of evacuation slots 292, 294 is not limited to the shown embodiment, and a larger or lower number of evacuation slots may be provided depending on the specific requirements. Further, although in the embodiment shown in FIG. 5 the evacuation channel 290 runs along the entire perimeter of the base 230, other configurations may be envisaged in which the evacuation channel 290 extends over only a portion of the relay base edge, for example, at areas where it is expected to accumulate more fluid.

Figure 6:
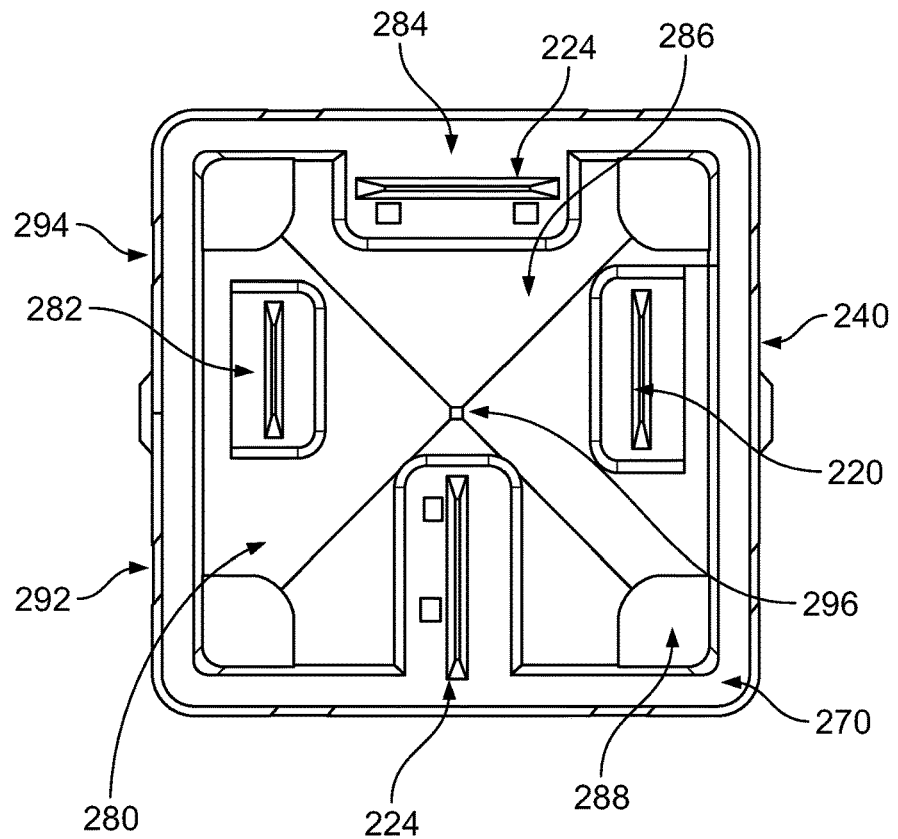
FIG. 6 is a top view of the sealed relay.

In order to deviate the fluid or dew condensate formed at the sealing plate 280 away from the relay terminals 220, 224 and towards the fluid apertures 282, 284, and/or the evacuation channel 290 described above, the sealing plate 280 may be provided with an outward profile. On the outward side opposed to the side that faces the base 230, the sealing plate 280 is shaped with a non-flat profile designed to divert the fluid condensate accumulated on the sealing plate 280 along specific direction(s) and away from the electrical terminals 220, 224, irrespectively from the orientation with which the sealed relay 200 is mounted. For instance, the outward surface of the sealing plate 280 may have one or more faces 286 as shown in FIG. 6 that are inclined with respect to the base 230. The inclined faces 286 divert the fluid or dew condensate that may form on the sealing plate 280 substantially along directions determined by the respective inclination angles and the orientation of the sealed relay 200.

In an embodiment, the outward surface of the sealing plate 280 comprises a plurality of inclined faces 286 having similar or different non-zero inclination angles with respect to the base 230, which ensures fluid diversion away from the relay terminals 220, 224 for every orientation of the sealed relay 200. In the configuration shown in FIG. 5, the outward surface comprises four inclined faces 286, each inclined face 286 having a triangular shape with respective apertures 282, 284 for passing the relay terminals 220, 224 and that is inclined with respect the base 230 by the same inclination angle ☐, resulting in an outward surface with a pyramidal shape. The dew condensate formed on each inclined face 286 will then be diverted towards the evacuation channel 290 immediately opposed to the lower edge of respective inclined face 286, when the sealed relay 200 is mounted with the relay terminals 220, 224 facing upwards as in the orientation shown in FIG. 5. In case the sealed relay 200 is mounted with the relay terminals 220, 224 facing downwards, the fluid formed at the sealing plate 280 is diverted along the inclined faces 286 towards the center 296 of the sealing plate 280 and then simply falls from the sealing plate 280 by the effect of gravity.

Additional features, such as flat depressions 288 may be provided at each corner of the outward surface of the sealing plate 280 for facilitating the recollection of fluid condensate that descends along the respective inclined faces at the base 230 corners, in particular when the sealed relay 200 is mounted upwards. As shown in FIG. 5, flat depressions 288 may be provided at each corner of the sealing plate 280 where two adjacent inclined faces 286 are joined and substantially aligned with the evacuating slots 292, 294 of the relay cover 240 so as to accumulate the fluid descending along the inclined faces 286 at the corners of the sealing plate 280 and guide the fluid towards the evacuating slots 292, 294. Consequently, with this configuration, the fluid condensate is efficiently diverted by the non-flat profile of the sealing plate 280 towards the corners of the base 230 and from which it can be easily expelled.

A top view of the sealing plate 280 mounted on the base 230 is shown in FIG. 6 for illustrating the arrangement of four triangular sections corresponding to the inclined faces 286 of the pyramidal shape shown in FIG. 5 and the respective flat depressions 288 at each corner of the sealing plate 280.

Figure 7:
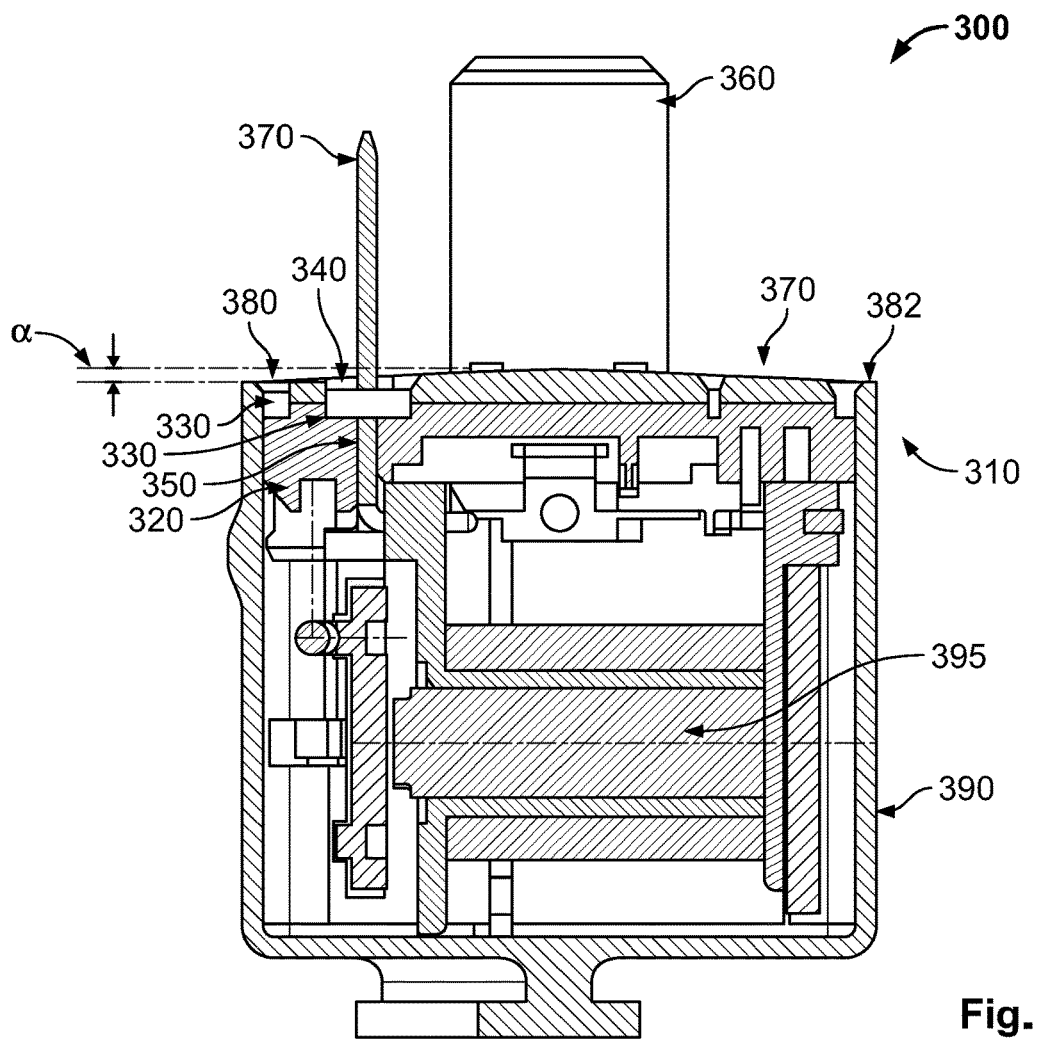
FIG. 7 is a sectional side view of a sealed relay according to another embodiment.

A sealed relay 300 and a seal housing 310 according to another embodiment is shown in FIG. 7. The embodiment of FIG. 7 differs from the embodiment described with reference to FIGS. 3-6 in that the relay base 320 includes one or more depressions 330 on the outwardly facing side to facilitate adhesion of the sealing compound 340 thereto. A sealing effect of the sealing compound 340 is further improved by defining at the relay base 320 the specific discrete regions where the sealing compound is to be applied. For instance, as shown in FIG. 7, one or more depressions 330 may be provided that circumvent each of the relay base apertures 350 and the respective relay terminals 360 protruding from the relay base 320. These depressions 330 are provided at matching locations below the apertures of the sealing plate 370. In the embodiment shown in FIG. 7, a stripe 380 of sealing compound is selectively applied on a sealing groove 382 that is formed on the relay base 320 for this purpose along the intersection between the base 320 and the housing cover 390. The sealing groove 382 may be formed by the lateral edge of the cover 390 that slightly extends above the outwardly facing side of the base 320 and a recess defined on the lateral side of the base 320 that contacts the cover 390.

The depressions 330 and the sealing groove 382 serve as reservoirs for fixing the sealing compound 340 at selected discrete regions of the relay base 320 where the sealing effect is actually needed, and reduce the amount of sealing compound applied to the base 320. Moreover, the depressions 330 and the sealing groove 382 allow to improve the adhesion of the sealing compound 340 to the base 320 in comparison to the case where the sealing compound is simply applied on top of the relay base around the electric terminals and/or at the intersection between the base and cover.

Figure 8:
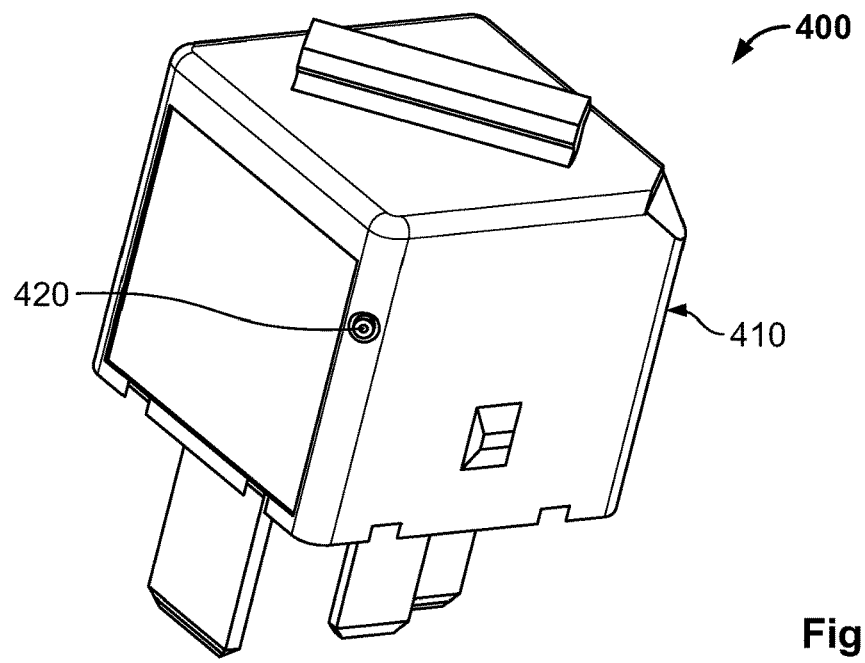
FIG. 8 is a perspective view of the sealed relay according to another embodiment.

A sealed relay 400 according to another embodiment shown in FIG. 8, viewed from a top side of the housing cover 410, has a nipp-off feature 420 to be closed after the sealing compound is cured to seal the relay completely.

Although the present invention has been mainly described above with reference to seal housing for an relay and the respective sealed relay using the seal housing, the principles of the present invention can also be advantageously applied to other types of electrical and/or electronic devices which require an efficient protection of the respective electrical terminals against short-circuits caused by dew condensate and/or moisture accumulated at the outside surfaces of the electrical devices.

What is claimed is:
1. A seal housing for an electrical device, comprising:
a base;

a cover adapted to cover an inwardly facing side of the base to form a closed chamber for accommodating components of the electrical device; and a sealing plate adapted to partially cover an outwardly facing side of the base, the sealing plate has an outward side with a profile that is shaped to divert fluid or fluid condensate formed at the outward side of the sealing plate, the sealing plate has a closed aperture through which an electrical terminal protrudes outward from the base, the aperture surrounds the electrical terminal and is separated from the electrical terminal that extends through the aperture by a separation gap, the aperture forming a closed fluid reservoir around the electrical terminal.

2. The seal housing of claim 1, wherein the outward side of the sealing plate includes an inclined face that is inclined with respect to the outwardly facing side of the base by an inclination angle different from zero that causes fluid condensate to descend along the inclined face.

3. The seal housing of claim 1, wherein the outward side of the sealing plate includes a plurality of inclined faces that are each inclined with respect to the outwardly facing side of the base by an inclination angle different from zero that causes fluid condensate to descend along each of the inclined faces.

4. The seal housing of claim 3, wherein the plurality of inclined faces form a pyramidal shape.

5. The seal housing of claim 1, wherein the sealing plate includes a second aperture open into an evacuation channel provided on the base.

6. The seal housing of claim 5, wherein the evacuation channel is located along an intersection edge of the base with the cover.

7. The seal housing of claim 5, wherein the cover includes a slot along the evacuation channel to expel the fluid condensate accumulated at the evacuation channel from the base.

8. The seal housing of claim 1, further comprising a sealing compound disposed at a discrete region around a base aperture of the base through which an electrical terminal protrudes outward from the base, the sealing compound sealing a junction between the electrical terminal and the base.

9. The seal housing of claim 8, wherein a size of the discrete region coincides with a size of the sealing plate aperture of the sealing plate through which the electrical terminal protrudes.

10. The seal housing of claim 8, wherein the sealing compound partially fills the separation gap to form a reservoir to collect fluid condensate diverted from the sealing plate.

11. The seal housing of claim 1, wherein the outwardly facing side of the base has a recess disposed below the aperture of the sealing plate, the recess adapted to be filled with a sealing compound.

12. The seal housing of claim 1, wherein the electrical device is an electromagnetic relay.

13. An electromagnetic relay, comprising:

an electrical terminal coupled to a relay assembly; and a seal housing including a base, a cover adapted to cover an inwardly facing side of the base to form a closed chamber for accommodating components of the relay assembly, and a sealing plate adapted to partially cover an outwardly facing side of the base, the sealing plate has an outward side with a profile that is shaped to divert fluid or fluid condensate formed at the outward side of the sealing plate, the sealing plate has an aperture through which the electrical terminal protrudes to an outside of the seal housing, the aperture surrounds the electrical terminal and is separated from the electrical terminal that extends through the aperture by a separation gap, the aperture is open into an evacuation channel provided on the base, the cover includes a slot along the evacuation channel to expel the fluid condensate accumulated at the evacuation channel from the base.

14. A sealing plate for protecting a base of an electrical device housing from fluid condensate, comprising:

a plurality of apertures extending through the sealing plate and through which a plurality of electrical terminals of an electrical component extend, each of the apertures surrounds one of the electrical terminals and is separated from the electrical terminal that extends through the aperture by a separation gap, at least one of the plurality of apertures is a closed aperture that forms a closed fluid reservoir around the electrical terminal; and an outward side having an inclined face that is inclined with respect to a side of the base on which the sealing plate is mounted so that fluid condensate descends along the inclined face.

15. The sealing plate of claim 14, wherein the outward side of the sealing plate includes a plurality of inclined faces that are each inclined with respect to the side of the base and the plurality of inclined faces form a pyramidal shape.

16. The sealing plate of claim 14, wherein the sealing plate is adapted to partially cover the base as to leave another separation gap to an edge of a cover surrounding the base.

17. The sealing plate of claim 14, wherein the separation gap and/or the another separation gap forms a reservoir for collecting fluid condensate.

18. The sealing plate of claim 17, wherein the cover includes a slot in communication with the separation gap and/or the another separation gap to expel the fluid condensate.

* * * * *